United States Patent [19]

Novotny

[11] Patent Number: 5,183,104
[45] Date of Patent: Feb. 2, 1993

[54] CLOSED-CYCLE EXPANSION-VALVE IMPINGEMENT COOLING SYSTEM

[75] Inventor: Shlomo D. Novotny, Wayland, Mass.

[73] Assignee: Digital Equipment Corporation, Maynard, Mass.

[21] Appl. No.: 798,821

[22] Filed: Nov. 1, 1991

Related U.S. Application Data

[63] Continuation of Ser. No. 367,355, Jun. 16, 1989, abandoned.

[51] Int. Cl.⁵ .................... H01L 23.467; F25B 9/08
[52] U.S. Cl. .................... 165/104.33; 165/104.34; 165/908; 62/259.2; 62/401; 361/384
[58] Field of Search .................. 62/259.2, 373, 401, 62/504; 165/104.33, 908, 80.4, 104.34; 361/385, 384

[56] References Cited

U.S. PATENT DOCUMENTS

| | | |
|---|---|---|
| 2,772,540 | 12/1956 | Vierkotter . |
| 3,843,910 | 10/1974 | Ringuet .................... 165/908 |
| 4,352,392 | 10/1982 | Eastman .................... 165/908 |
| 4,498,118 | 2/1985 | Bell .......................... 165/908 |
| 4,621,279 | 11/1986 | Maier et al. . |
| 4,690,210 | 9/1987 | Niggemann et al. . |
| 4,697,427 | 10/1987 | Niggemann et al. .......... 361/385 |
| 4,741,385 | 5/1988 | Bergles et al. ............. 165/908 |
| 4,750,086 | 6/1988 | Mittal ....................... 361/385 |
| 4,761,556 | 8/1988 | Simpson et al. . |
| 4,838,041 | 6/1989 | Bellows et al. ............. 165/908 |
| 4,912,600 | 3/1990 | Jaeger et al. .............. 165/80.4 |

*Primary Examiner*—Albert W. Davis, Jr.
*Attorney, Agent, or Firm*—Arnold, White & Durkee

[57] ABSTRACT

A closed-cycle expansion-valve impingement cooling system provides cooling for electronic components that have a high-density heat flux. Coolant passes from a compressor to a supply heat exchanger where its temperature is reduced and from there to an impingement plenum of a cooling chamber. Expanded cooling medium, at substantially reduced temperature, directly impinges on the electronic components to be cooled, thereby removing heat from the components. The heated coolant then returns to the compressor through a return heat exchanger. The cooling medium may be air or may undergo a phase change at the surface of the components, thereby improving the efficiency of heat removal.

14 Claims, 2 Drawing Sheets

CLOSED-CYCLE EXPANSION-VALVE IMPINGEMENT COOLING SYSTEM

This application is a continuation of application Ser. No. 367,355, filed Jun. 16, 1989, now abandoned.

RELATED APPLICATION

This invention is related to the following application which is assigned to the assignee of the present invention and concurrently filed herewith in the name of the inventor of the present invention:

OPEN-CYCLE EXPANSION-VALVE AIR-IMPINGEMENT COOLING APPARATUS

Ser. No. 367,369, now abandoned.

BACKGROUND OF THE INVENTION

1. Field of the Invention

This invention relates to a method and apparatus for cooling integrated circuit devices. More particularly, it relates to a closed-cycle coolant medium impingement cooling system and method that does not require a refrigeration cycle after the compression stage of the cooling system.

2. Prior Art

Each generation of semiconductor integrated circuits develops smaller and more closely packed devices. This higher integration generates greater component density and permits more circuit functions to be performed on a single semiconductor chip. On the other hand, packing more and more circuit elements closer and closer together generates greater heat and concentrates this heat in a smaller chip area. To ensure proper circuit performance, durability, and reliability, a way must be found to remove this heat to maintain device junction temperatures below some maximum value.

Conventional methods of cooling integrated circuits or a printed circuit board having a number of integrated circuits mounted on them include natural convection, forced convection (fan cooling), liquid cooling, various forms of heat sink, and a combination of two or more of these methods. However, all of these known methods are unsatisfactory because they are ineffective at present heat flux densities, inefficient, and/or expensive to operate. Known methods particularly suffer from a low power-density limitation.

In most known mounted component cooling systems, the heat removal capability of the system is limited by the thermal resistance of the interface of the device and its mounting. By cooling a coolant medium gas with an expansion valve, an interface thermal resistance can be tolerated. Other methods developed to pre-cool impingement air or other coolant medium include an additional refrigeration cycle, where the coolant passes through a refrigeration (cold) heat exchanger. In open-cycle cooling systems, condensation of water can be a major problem. In addition, the integrated circuit chips may be cooled directly, minimizing the interface resistance between the chips and the cooling medium.

It would therefore be advantageous to provide a cooling system to maintain electronic component junction temperatures below a prescribed maximum at high heat flux densities. Further, the present closed cycle system provides high heat transfer by utilizing gases other than air which have high heat transfer properties, such as helium, freon and the like, thus providing very efficient heat transfer. Such a system also eliminates the introduction of impurities, contaminants, or moisture into the cooling system.

SUMMARY OF THE INVENTION

The present invention effectively removes high density heat from electronic components, heat flux, for example at greater than 20 watts per square centimeter. A compressor pressurizes a cooling medium and provides this pressurized cooling medium to a first heat exchanger. The heat exchanger may use air at ambient temperature to reduce the temperature of the pressurized cooling medium, preferably to close to room temperature. The cooling medium passes to a cooling chamber which can be an impingement plenum or a flow distribution chamber. The impingement plenum is fed the cooling medium through an expansion valve which cools the medium and then directs the expanded and cooled cooling medium directly onto the chips to be cooled. The flow distribution chamber is first pressurized by the cooling medium at approximately compressor outlet pressure, and then uses a number of expansion valves to direct the cooling medium onto the chips. In either embodiment, the cooling medium is collected, directed through another heat exchanger, and sent back to the inlet of the compressor.

In this way, the system removes high heat densities from the semiconductor chips to ensure that device junction temperatures are maintained below a specified limit.

DETAILED DESCRIPTION OF PREFERRED EMBODIMENTS

Figure 1:
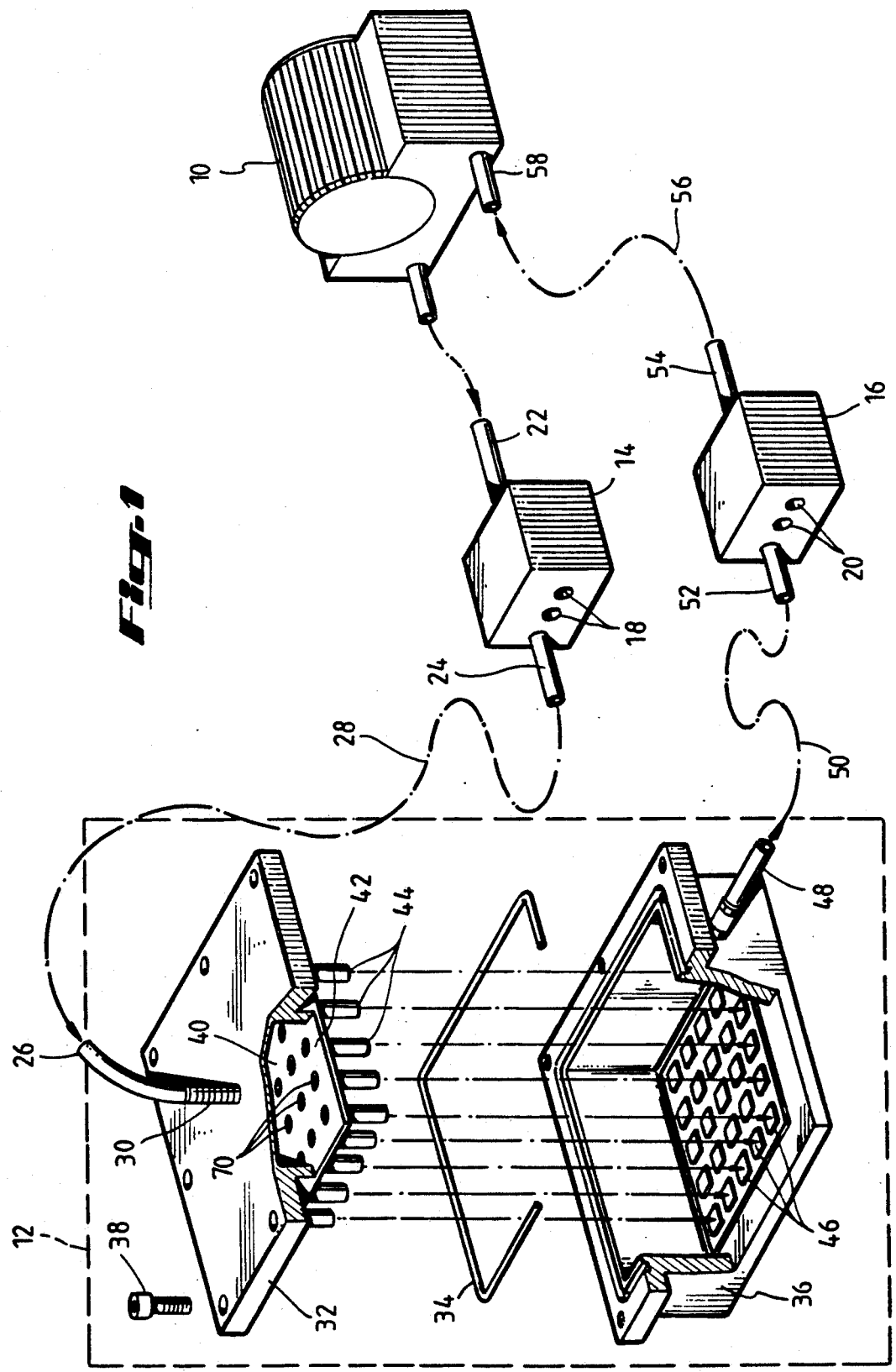
FIG. 1 is an exploded, partially cut-away diagram of one embodiment of the present invention.

FIG. 1 depicts a closed-cycle expansion-valve impingement cooling system of the present invention. The cooling system comprises a compressor 10, a containment chamber 12, an inlet or supply heat exchanger 14, and an outlet or return heat exchanger 16. The supply and return heat exchangers 14 and 16 may be of various designs such as tube-in-tube, counterflow, crossflow, or the like, and may use air or other gas as the heat exchange medium to eliminate the need for a separate refrigerant cooling system. The inlet heat exchanger 14 may include one or more outlet ports 18 to accommodate a number of containment chambers like that of the containment chamber 12. Similarly, the outlet heat exchanger 16 may include one or more inlet ports 20 to receive the cooling medium from a number of containment chambers.

The compressor 10 compresses a cooling medium, which may be air, helium, freon, and the like, and delivers the compressed cooling medium to the supply heat exchanger through a tube 22. At least one tube 24 carries the cooling medium to a containment chamber 12, but the supply heat exchanger 14 may accommodate more tubes like that of the tube 24 at the outlet ports 18.

The tube 24 continues to a tube 26, by way of a path shown schematically as a line 28. The tube 26 mates to the cooling chamber 12 through an inlet nozzle 30. The cooling chamber 12 primarily comprises an upper seal-plate 32, a seal-ring 34, and a lower housing 36. The cooling chamber assembly may be held together by bolts 38 or other appropriate means.

The cooling medium exiting the inlet nozzle 30 enters a space 40 within the upper seal-plate 32. The space 40 allows the cooling medium to rapidly expand and thereby drop substantially in temperature. The bottom of the space 40 forms an impingement plenum 42. The impingement plenum 42 supports a plurality of coolant exit or exhaust tubes 44 that direct the flow of coolant onto the objects, such as semiconductor integrated circuit chips 46, to be cooled. Alternatively, the coolant may exit the space 40 directly through a plurality of holes or orifices 70, rather than through the exhaust tubes 44. There may be one or more tubes 44 or orifices 70 for each chip 46 to be cooled.

After impinging on the elements to be cooled, the heated coolant exits the lower housing 36 by way of an outlet port 48. The heated coolant passes to the return heat exchanger 16 by a path shown graphically as a line 50. The coolant passes into the return heat exchanger 16 through an inlet tube 52. The return heat exchanger 16 may accommodate a number of inlet tubes like inlet tube 52 at the inlet ports 20.

The return heat exchanger 16 cools the heated cooling medium and the compressor 10 draws the cooling medium through a tube 54, over a path shown graphically as a line 56, and into the compressor inlet port 58.

Figure 2:
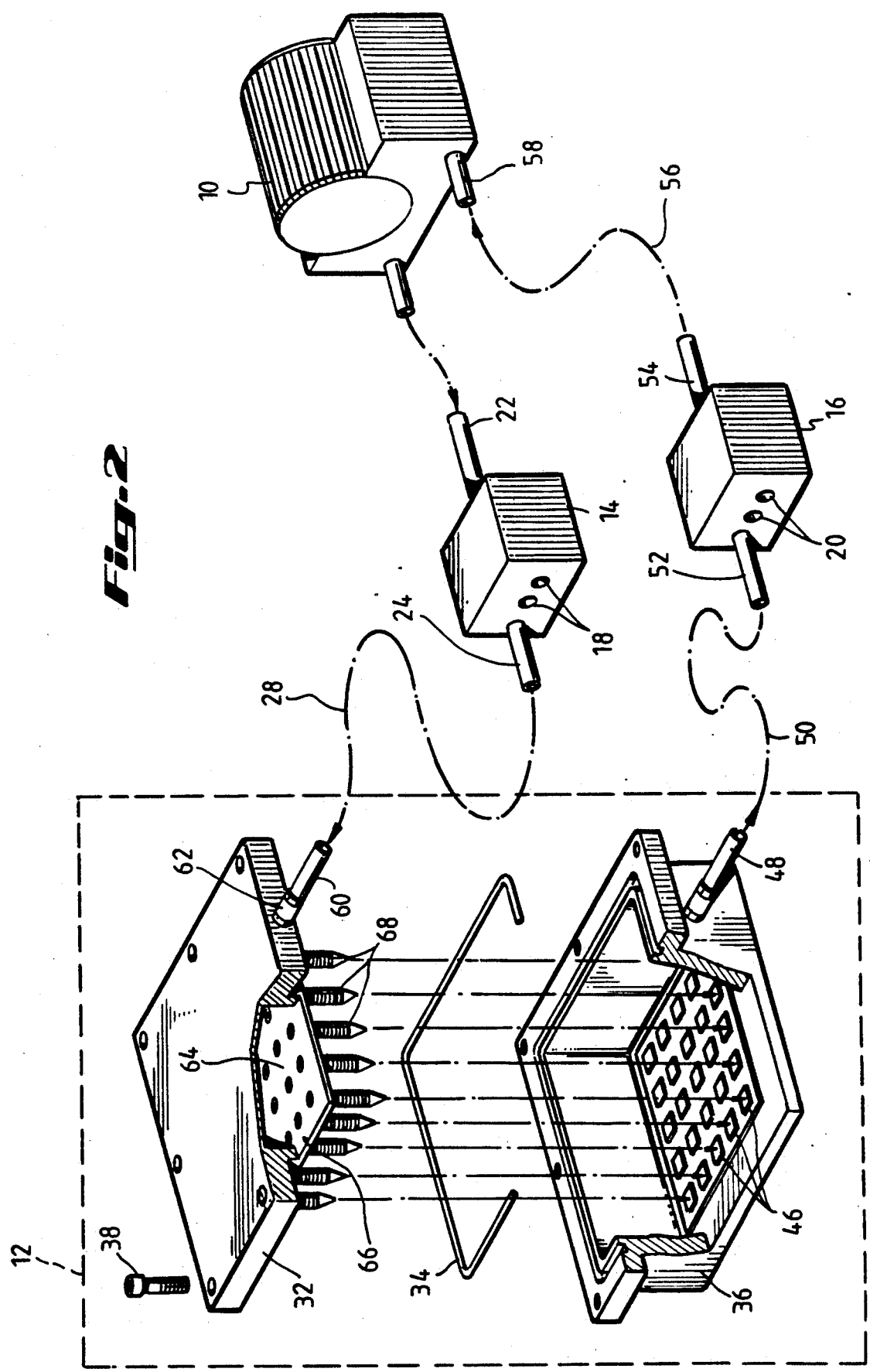
FIG. 2 is an exploded, partially cut-away diagram of another embodiment of the present invention.

FIG. 2 depicts an alternative embodiment of the present invention. Elements in FIG. 2 that perform the same functions as like elements in FIG. 1 bear the same reference numbers and their functions will not be reiterated.

The embodiment of FIG. 2 differs from that of FIG. 1 within the cooling chamber 12. The cooling medium enters the cooling chamber through an inlet port 60. The inlet port 60 may attach to the upper seal-plate 32 by way of a quick air-disconnect 62 in a manner known in the art. The incoming cooling medium pressurizes a flow distribution plenum 64. A lower support plate 66 supports a plurality of expansion valves 68. The valves 68 direct the expanded and cooled coolant directly onto the chips 46 that require cooling. Again, there may be one or more valves 68 directed toward each of the chips 46 that require cooling. Further, the direction of the valve openings may be so selected that the coolant is directed to one or more portions of the surface of the chip 46. The cooling medium, as it expands from the valves 68, drops in temperature, and carries away heat from the chips 46.

Rather than using a cooling medium that remains in a gaseous state throughout the cycle, the present invention may advantageously employ a cooling medium that is a liquid or partially a liquid in the supply portion of the cycle and a gas in the return portion. Such a system would direct a liquid onto the objects to be cooled and the temperature of the cooling liquid should preferably be at or near its vaporization temperature when it impinges on the hot objects. In this way, when the cooling medium evaporates or vaporizes (changes phase), it removes heat from the objects equivalent to its heat of vaporization which is many times more effective than just raising the temperature of a gas or a liquid (sensible heat transfer). In this embodiment of the present invention, the air or other medium that cooled the system's cooling medium in the heat exchanger 14 could be used in the heat exchanger 16 to ensure the cooling medium is in a gaseous state at the inlet 58 to the compressor 10. In this embodiment, the heat exchanger 16 acts as an evaporator or heater rather than as a cooler and the heat exchanger 14 may act as a condenser. Further, temperatures and pressures within this embodiment depend on the selected cooling medium.

Although the invention has been described with reference to specific embodiments, these embodiments should not be construed as limiting the scope of the invention. It will be clear to those skilled in the art with the benefit of this disclosure that certain modifications can be made without deviating from the spirit of the invention. For example, a chip 46 may be any element that requires cooling.

I claim:

1. A closed-cycle expansion-valve gaseous-coolant-impingement element-cooling apparatus comprising:
   a. a compressor for substantially compressing a gaseous-coolant, the compressor having an inlet and an outlet, the compressor arranged to substantially raise the temperature and pressure of the gaseous-coolant;
   b. a first cooler coupled to the outlet of the compressor for cooling gaseous-coolant received from the compressor;
   c. a cooling chamber that receives substantially compressed gaseous-coolant from the first heat exchanger and supplies expanded, substantially cooled gaseous-coolant by means of one or more expansion valves within the cooling chamber toward the elements to be cooled, the expansion valves serving to substantially lower the pressure of the gaseous-coolant and to lower the temperature of the gaseous-coolant to below ambient; and
   d. a second cooler coupled between the cooling chamber and the inlet to the compressor for cooling expanded gaseous-coolant received from the cooling chamber and returning the gaseous-coolant to the compressor.

2. The apparatus of claim 1, wherein the gaseous-coolant is air.

3. A closed-cycle expansion-valve gaseous-coolant-impingement cooling apparatus comprising:
   a. a compressor for substantially compressing gaseous-coolant, the compressor having an inlet and an outlet, the compressor arranged to substantially raise the temperature and pressure of the gaseous-coolant;
   b. a first cooler coupled to the outlet of the compressor for cooling gaseous-coolant received from the compressor;
   c. a cooling chamber having an expansion means, the expansion means including an expansion valve that receives compressed gaseous-coolant from the first heat exchanger and substantially lowers the pressure of the gaseous-coolant and lowers the temperature of the gaseous-coolant to below ambient, an impingement plenum coupled to the expansion valve to provide an expansion volume, and a plurality of outlets from the expansion volume; and
   d. a second cooler coupled between the cooling chamber and the inlet to the compressor for cooling expanded gaseous-coolant received from the cooling chamber and returning the gaseous coolant to the compressor.

4. A cooling apparatus according to claim 3 wherein the outlets from the expansion volume comprise a plurality of tubes so situated as to direct the expanded, cooled coolant medium to an article to be cooled.

5. The apparatus of claim 3, wherein the gaseous-coolant is air.

6. A closed-cycle expansion-valve gaseous-coolant-impingement cooling apparatus comprising:
  a. a compressor for compressing gaseous-coolant, the compressor having an inlet and an outlet, the compressor arranged to substantially raise the temperature and pressure of the gaseous-coolant;
  b. a first cooler coupled to the outlet of the compressor for cooling gaseous-coolant received from the compressor;
  c. a cooling chamber having an expansion means, the expansion means including receiving means for receiving compressed gaseous-coolant from the first heat exchanger, a flow distribution plenum pressurized by the gaseous-coolant from the receiving means, and a plurality of expansion valves connected to the flow distribution plenum, the expansion valves arranged to substantially lower the pressure of the gaseous-coolant and to lower the gaseous-coolant to below ambient; and
  d. a second cooler coupled between the cooling chamber and the inlet to the compressor for cooling expanded gaseous-coolant received from the cooling chamber and returning the gaseous coolant to the compressor.

7. A cooling apparatus according to claim 6 wherein the plurality of expansion valves are so arranged as to direct expanded, cooled coolant medium to an article to be cooled.

8. The apparatus of claim 6, wherein the gaseous-coolant is air.

9. A method of cooling a plurality of hot objects comprising the steps of:
  a. substantially compressing gaseous-coolant in a compressor to substantially raise the temperature and pressure of the gaseous-coolant;
  b. cooling the compressed gaseous-coolant in a first cooler;
  c. expanding the cooled and compressed gaseous-coolant with one or more expansion valves to substantially lower the pressure of the gaseous-coolant and lower the temperature of the gaseous-coolant to below ambient;
  d. directing the expanded gaseous-coolant onto the objects to be cooled; and
  e. collecting the expanded gaseous-coolant, cooling the collected gaseous-coolant in a second cooler, and returning the cooled collected gaseous-coolant to the compressor.

10. A method according to claim 9 wherein the expanded cooling medium is directed uniformly across the objects to be cooled.

11. The method of claim 9, wherein the gaseous-coolant is air.

12. A method of cooling a plurality of hot objects comprising the steps of:
  a. compressing gaseous-coolant in a compressor to substantially raise the temperature and pressure of the gaseous-coolant;
  b. cooling the gaseous-coolant in a first cooler;
  c. pressurizing a distribution plenum with the cooled and compressed gaseous-coolant;
  d. expanding the cooled and compressed gaseous-coolant through a plurality of expansion valves directed at the hot objects to be cooled thus substantially lowering the pressure of the gaseous-coolant and lowering the temperature of the gaseous-coolant to below ambient; and
  e. collecting the expanded gaseous-coolant, cooling the collected gaseous-coolant in a second cooler, and returning the cooled collected gaseous-coolant to the compressor.

13. A method according to claim 12 wherein a plurality of said valves are directed toward each of the objects to be cooled.

14. The method of claim 12, wherein the gaseous-coolant is air.

* * * * *